(12) United States Patent
Huang et al.

(10) Patent No.: US 7,292,079 B2
(45) Date of Patent: Nov. 6, 2007

(54) DLL-BASED PROGRAMMABLE CLOCK GENERATOR USING A THRESHOLD-TRIGGER DELAY ELEMENT CIRCUIT AND A CIRCULAR EDGE COMBINER

(75) Inventors: Hong-Yi Huang, Hsinchu (TW); Jian-Hong Shen, Hsinchu (TW); Yuan-Hua Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 234 days.

(21) Appl. No.: 11/194,628

(22) Filed: Aug. 2, 2005

(65) Prior Publication Data

US 2007/0030041 A1   Feb. 8, 2007

(51) Int. Cl.
*H03L 7/06* (2006.01)

(52) U.S. Cl. ............... 327/158; 327/264; 327/283; 327/161

(58) Field of Classification Search ............... 327/261, 327/263, 264, 276, 278, 281, 283, 285, 288, 327/290
See application file for complete search history.

(56) References Cited

U.S. PATENT DOCUMENTS

| | | | |
|---|---|---|---|
| 6,617,903 B2 * | 9/2003 | Kawamura | 327/261 |
| 6,633,189 B1 * | 10/2003 | Gradinariu et al. | 327/262 |
| 6,728,334 B1 * | 4/2004 | Zhao | 378/62 |
| 2003/0184337 A1 | 10/2003 | Huang | |

OTHER PUBLICATIONS

John G. Maneatis, "Low-Jitter Process-Independent DLL and PLL Based on Self-Biased Techniques", IEEE Journal of Solid-State Circuits, vol. 31, No. 11, Nov. 1996.
Mohammad Maymandi-Nejad et al., "A Digitally Programmable Delay Element: Design and Analysis", IEEE Transactions on Very Large Scale Integration (VLSI) Systems, vol. 11, No. 5, Oct. 2003.
Mark G. Johnson et al., "A Variable Delay Line PLL for CPU-Coprocessor Synchronization", IEEE Journal of Solid-State Circuits, vol. 23, No. 5, Oct. 1988.
Jørgen Christiansen, "An Integrated High Resolution CMOS Timing Generator Based on an Array of Delay Locked Loops", IEEE Journal of Solid-State Circuits, vol. 31, No. 7, Jul. 1996.
Deog-Kyoon Jeong et al., "Design of PLL-Based Clock Generation Circuits", IEEE Journal of Solid-State Circuits, vol. SC-22, No. 2, Apr. 1987.

(Continued)

*Primary Examiner*—Linh My Nguyen
*Assistant Examiner*—Colleen O'Toole
(74) *Attorney, Agent, or Firm*—Harness, Dickey & Pierce, P.L.C.

(57) ABSTRACT

A DLL-based programmable clock generator using a threshold-trigger delay element and an edge combiner is proposed. A threshold-trigger delay element with full swing complementary output signals consumes no dc power. It exhibits small delay error resulting reduced out jitter. It also increases the linearity of delay time versus control voltage. The circular edge combiner can multiply the input signal at a lower supply voltage. The rise and fall time of output signal are more symmetrical. It also present the multiplication factor of the clock generator can be easy to choose with the increasing of the number of delay elements.

14 Claims, 14 Drawing Sheets

OTHER PUBLICATIONS

George Chien et al., "A 900-MHZ Local Oscillator Using a DLL-Based Frequency Multiplier Technique for PCS Applications", IEEE Journal of Solid-State Circuits, vol. 35, No. 12, Dec. 2000.

David J. Foley et al., "CMOS DLL-Based 2-V 3.2-ps Jitter 1-GHZ Clock Synthesizer and Temperature-Compensated Tunable Oscillator", IEEE Journal of Solid-State Circuits, vol. 36, No. 3, Mar. 2001.

Chulwoo Kim et al., "Low-Power Small-Area ± 7.28ps Jitter 1GHz DLL-Based Clock Generator", ISSCC 2002/ Session 8/ High Speed Timing /8.3.

Hong-Yi Huang, "Threshold Triggers and Accelerator for Deep Submicron Interconnection", 2002 IEEE.

Cheng-Jia et al., "Capacitor Coupling Threshold Logic", 2002 IEEE.

Pietro Andreani et al., "On the Use of MOS Varactors in RF VCO's", IEEE Journal of Solid-State Circuits, vol. 35, No. 6, Jun. 2000.

Yongsam Moon et al., "An All-Analog Multiphase Delay-Locked Loop Using a Replica Delay Line for Wide-Range Operation and Low-Jitter Performance", IEEE Journal of Solid-State Circuits, vol. 35, No. 3, Mar. 2000.

Guang-Kaai Dehng et al., "Clock-Deskew Buffer Using a SAR-Controlled Delay-Locked Loop", IEEE Journal of Solid-State Circuits, vol. 35, No. 8, Aug. 2000.

Floyd M. Gardner, "Charge-Pump Phase-Lock Loops", IEEE Transactions on Communications, vol. COM-28, No. 11, Nov. 1980.

Hee-Tae Ahn et al., "A Low-Jitter 1.9-V CMOS PLL for UltraSPARC Microprocessor Applications", IEEE Journal of Solid-State Circuits, vol. 35, No. 3, Mar. 2000.

Woogeun Rhee, "Design of High-Performance CMOS Charge Pumps in Phase-Locked Loops", 1999 IEEE.

Manuel Mota et al., "A High-Resolution Time Interpolator Based on a Delay Locked Loop and an RC Delay Line", IEEE Journal of Solid-State Circuits, vol. 34, No. 10, Oct. 1999.

Hong-Yi Huang et al., "A DLL-Based Programmable Clock Generator Using Threshold-Trigger Delay Element and Circular Edge Combiner", 2004 IEEE Asia-Pacific Conference on Advanced System Integrated Circuits(AP-ASIC2004)/ Aug. 4-5, 2004.

* cited by examiner

| MULTIPLICATION FACTOR | NMOS $X_1X_0$ | $P_1P_2$ | | $P_5P_6$ | $P_9P_{10}$ | $P_{13}P_{14}$ | $P_{17}P_{18}$ | $P_{21}P_{22}$ |
|---|---|---|---|---|---|---|---|---|
| | | Case1 | $\varphi_1\varphi_2$ | | | | | |
| | | Case2 | $\varphi_7\varphi_5$ | | | | | |
| ×1 | 00 | | | 00 | 00 | 00 | 00 | 00 |
| ×2 | 01 | $\varphi_3\varphi_{11}$ | | $\varphi_9\varphi_4$ | 00 | 00 | 00 | 00 |
| ×3 | 10 | $\varphi_2\varphi_9$ | | $\varphi_6\varphi_1$ | $\varphi_{10}\varphi_5$ | 00 | 00 | 00 |
| ×6 | 11 | $\varphi_1\varphi_8$ | | $\varphi_3\varphi_{10}$ | $\varphi_5\varphi_{12}$ | $\varphi_7\varphi_2$ | $\varphi_9\varphi_4$ | $\varphi_{11}\varphi_6$ |

| | PMOS $X_1X_0$ | $P_3P_4$ | | $P_7P_8$ | $P_{11}P_{12}$ | $P_{15}P_{16}$ | $P_{19}P_{20}$ | $P_{23}P_{24}$ |
|---|---|---|---|---|---|---|---|---|
| | | Case1 | $\varphi_1\varphi_2$ | | | | | |
| | | Case2 | $\varphi_7\varphi_4$ | | | | | |
| ×1 | 00 | | | 11 | 11 | 11 | 11 | 11 |
| ×2 | 01 | $\varphi_{12}\varphi_8$ | | $\varphi_6\varphi_3$ | 11 | 11 | 11 | 11 |
| ×3 | 10 | $\varphi_{10}\varphi_5$ | | $\varphi_2\varphi_9$ | $\varphi_6\varphi_1$ | 11 | 11 | 11 |
| ×6 | 11 | $\varphi_8\varphi_3$ | | $\varphi_{10}\varphi_5$ | $\varphi_{12}\varphi_7$ | $\varphi_2\varphi_9$ | $\varphi_4\varphi_{11}$ | $\varphi_6\varphi_1$ |

FIG. 13

US 7,292,079 B2

DLL-BASED PROGRAMMABLE CLOCK GENERATOR USING A THRESHOLD-TRIGGER DELAY ELEMENT CIRCUIT AND A CIRCULAR EDGE COMBINER

FIELD OF THE INVENTION

The present invention relates to a clock generator, and more particularly, to a clock generator using a threshold-trigger delay element circuit and a circular edge combiner.

BACKGROUND OF THE INVENTION

A clock generator is essential in modern computer systems and consumer products. A clock generator with a delay-locked loop (DLL) may be employed in a computer system as a clock generator or radio communication as a clock synthesizer. Most clock generators adopt phase-locked loop (PLL) scheme; however, a delay-locked loop (DLL) having features of low jitter, better stability and small area is more suitable than a phase-locked loop as a clock multiplier.

A traditional DLL-based clock generator 100 is illustrates in FIG. 1. A reference frequency Fin is delivered into the voltage control delay line 101 and the phase detector 102. The phase detector 102 detects the phase of the input frequency Fin and generates control signals to the charge pump 103 for charge and discharge operation. The low pass filter 104 filters the output signals of the charge pump 103. The voltage controlled delay line 101 generates multi-phase signals to the edge combiner 105 in response to the reference frequency Fin and the filleted signal from the low pass filter 104. The edge combiner 105 is used as a local oscillator in the clock generator 100 to generator an output frequency Fout multiplied by a ratio of the input frequency. The programmable scheme was not realized.

A differential symmetric load delay element and current starved delay element used in the voltage control delay line 101 is illustrated in FIG. 2 and FIG. 3.

The delay element in FIG. 2 includes a plurality of transistors forming a differential pair. PMOS 111 and 112 are connected in parallel, while PMOS 113 and 114, which form a symmetry load, are connected in parallel. The input signals Vi+, Vi− are delivered to the gate of the NOMS 115, 116 and the output signals Vo+, Vo− are obtained at the source of the NMOS 115 and the NMOS 116 respectively.

The delay element in FIG. 3 includes a plurality of transistors. The transistors 121, 122 are PMOS. The input signal Vi is delivered to the gate of the PMOS 123 and NMOS 124, while the output signal Vo is obtained at the drain of the PMOS 125 and the source of the NMOS 126. Further, NMOS 127 is connected with the PMOS 121, and NMOS 128 is connected with the NMOS 124.

The circuit in FIG. 2 may have drawback of unbalanced rise and fall operation. Therefore, the duty cycle is dependent on the control voltage. Further, there is a dependency on the output signal jitter according to the unbalanced operation. The circuit also consumes DC power with no full swing output signal. The variable amplitude of the output signal leads to asymmetrical charging and discharging operation. Thus, a non-50% duty cycle occurs owing to the rise and fall delay. The traditional current starved delay elements perform nonlinear delay characteristic. The circuits in FIGS. 2 and 3 have a very nonlinear delay feature. The delay time versus the controlling voltage curve performs high gain including signal jitter, When the control voltage is smaller than the threshold voltage (Vgs<Vtn) of the system, the conducting current would be very small and the delay time increases to a very large scale.

The edge combiner used in the clock generator of the prior art is illustrated in FIG. 4. It has a limitation on the minimum supply voltage because of its source-follower structure N1, N2 and three inverters 131~133 are connected in series, the output terminal of the last of which is connected to the gate of the NMOS N1. The drain of N1 is connected to the gate of the PMOS P1 and the drain of the PMOS P3 respectively, while the source of N2 is connected to the PMOS P2 and the drain of the NMOS N3.

If the signal at the node Q is VDD, then the signal at the node X is VDD, At the rising edges of the signals A1, A2, . . . An, the signal at the node Y is pulled up through the source follower structure composed of two NMOSs N1 and N2. If the signal at the node Q is GND, then the signal at node Y is GND. At the rising edges of the signals A1, A2, . . . An, the signal at the node X is pulled downed through N1 and N2. The weak cross-coupled inverters are used to obtain full-swing signals and avoid floating of the signals at the nodes X and Y. The discharge of the signal at node X and charge of the signal at node Y are asymmetrical. It is difficult to obtain equal rise and fall operation of the signal at the node Q. The asymmetrical rise and fall delay results in a larger jitter on the output signal, Moreover, the source follower structure has limitation on the minimum supply voltage and maximum operating frequency. The structure also has a drawback of asymmetric rise and fall performance.

A DLL-based frequency synthesizer used AND-OR gates as a combiner to multiply the input frequency by fixed times. The programmable scheme is not realized. Moreover, the signal delay paths through the multi-input logic gates are complicated. The rise and fall delay time are difficult to be balanced.

SUMMARY OF THE INVENTION

Therefore, a threshold-trigger delay element circuit, a circuit edge combiner, and a clock generator having the same are provided to substantially abbreviate the drawbacks problems in the prior art.

In one features, A circuit for delaying an input signal comprising: a first and a second high-threshold capacitor-coupling trigger, which receive an input signal at an input terminal of the trigger, and outputs an output signal at an output terminal of the trigger according to the input signal, each comprising: voltage step-down detecting means, with an output terminal, in response to a slow decrease in the voltage level of the input signal, for producing a step-down signal at the output terminal of the voltage step-down detecting means, wherein the step-down signal corresponds to and is delayed against the slow decrease during the slow increase; a first capacitor, coupled to the output terminal of the voltage step-down detecting means at one terminal of the first capacitor, for coupling the step-down signal with the other terminal of the first capacitor; voltage step-down charging means, having an input terminal coupled to the other terminal of the first capacitor, having an output terminal coupled to the output terminal of the trigger, and being controlled by the step-down signal from the first capacitor, for charging the output terminal of the trigger; voltage step-up detecting means, in response to a slow increase in the voltage level of the input signal, for producing a step-up signal corresponding to and being delayed against the slow increase during the slow increase; a second capacitor, coupled to an output terminal of the voltage step-up detecting means at one terminal of the second capacitor, for coupling the step-up signal with the other terminal of the second capacitor; voltage step-up discharging means, having an input terminal coupled to the other terminal of the second capacitor, having an output terminal coupled to the input terminal of the trigger, and being controlled by the step-up signal from the second capacitor, for discharging the output terminal of the trigger; a first inversion-mode PMOS capacitor, the gate being coupled to the other terminal of the first capacitor, for control the delay time of the output signal in response to a control voltage; a second inversion-mode PMOS capacitor the gate being coupled to the other terminal of the second capacitor, for control the delay time of the output signal in response to a control voltage; a first inverter, the input terminal and the output terminal of the first inverter being coupled to the output terminal of the first high-threshold capacitor-coupling trigger and the output terminal of the second high-threshold capacitor-coupling trigger respectively; and a second inverter, the input terminal and the output terminal of the first inverter being coupled to the output terminal of the second high-threshold capacitor-coupling trigger and the output terminal of the first high-threshold capacitor-coupling trigger respectively.

In other features, a circuit for outputting a frequency in response to a plurality of n-phase delay signal comprising a plurality of first inverters connected in series; a second inverter and a third inverter, the input terminal of the second inverter being coupled to the output terminal of the third inverter, and the output terminal of the second inverter being coupled to the input terminal of the third inverter and the input terminal of the first inverter of the plurality of the first inverters; a first PMOS, the source and the gate of the first PMOS being coupled to a power terminal and the output of the last inverter of the first inverters; a second PMOS, the source and the drain being coupled to the power terminal and the input terminal of the first inverter of the plurality of the first inverters; n sets of cascaded NMOS, one terminal of the cascaded NMOS being coupled to the gate of the second PMOS, and the other terminal of the cascaded NMOS being coupled to the ground; a first NMOS, the drain and the gate of the first NMOS being coupled to the ground and the output of the last inverter of the first inverters; a second NMOS, the drain and the source the being coupled to the ground and the drain of the second PMOS; and n sets of cascaded PMOS, one terminal of the cascaded PMOS being coupled to the power terminal, and the other terminal of the cascaded PMOS being coupled to the gate of the second NMOS.

The delay element consumes no DC power and performs full output swing. It exhibits small delay jitter resulting reduced out jitter. It also increases the linearity of delay time versus control voltage. An edge combiner using double edge scheme may overcome the drawbacks of the circuit in the prior art to reduce minimum supply voltage and perform symmetrical rise and fall time.

According to the clock generator of the embodiment, a programmable circuit is designed with balanced loading on all delay paths of multi-phase signals to reduce output clock jitter.

Further areas of applicability of the invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 13 lists the conditions of the inputs to programmable edge combiner.

DETAILED DESCRIPTION OF THE PREFERRED EMBODIMENTS

Figure 1:
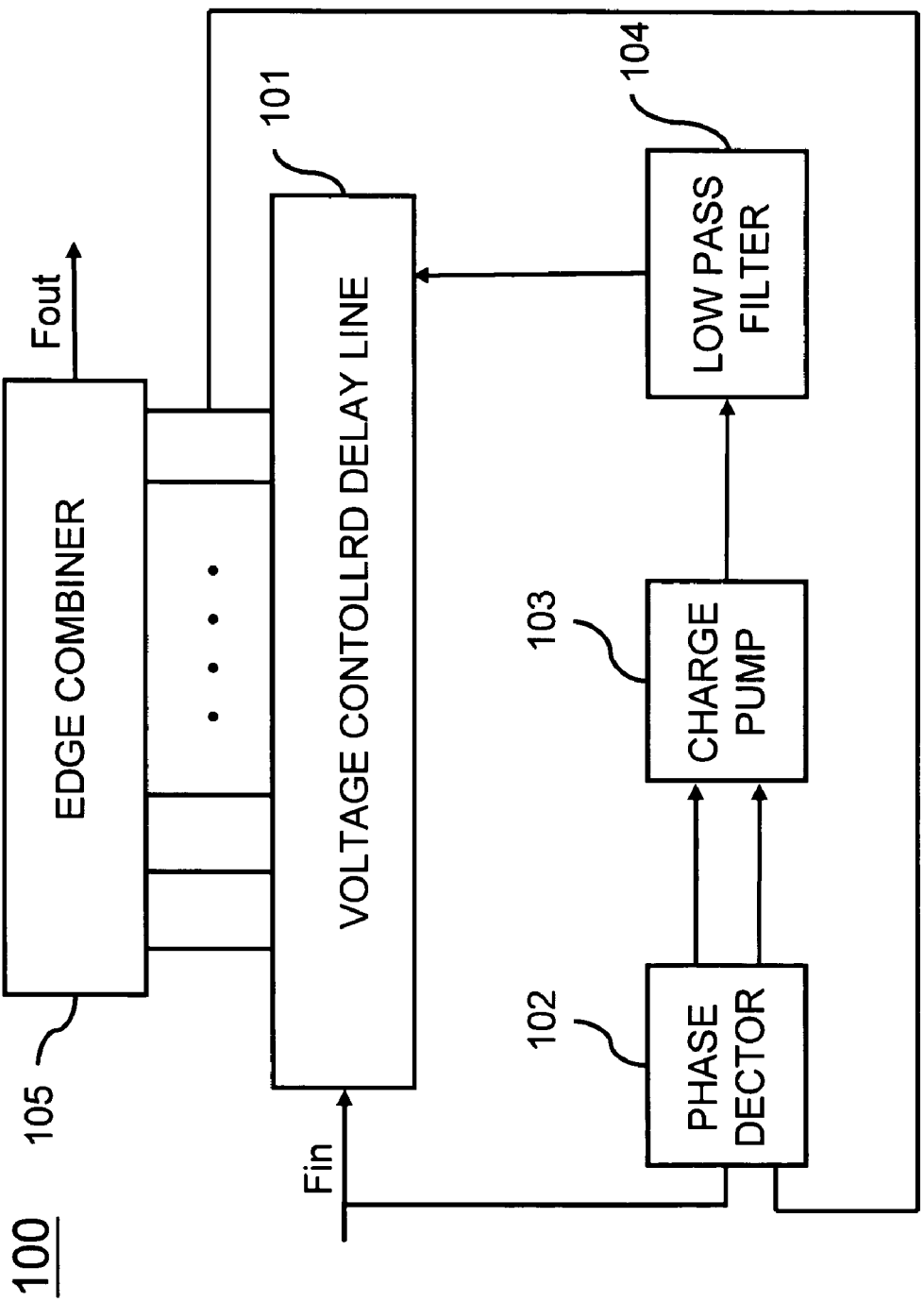
FIG. 1 depicts a DLL-based clock generator of the prior art.
Figure 2:
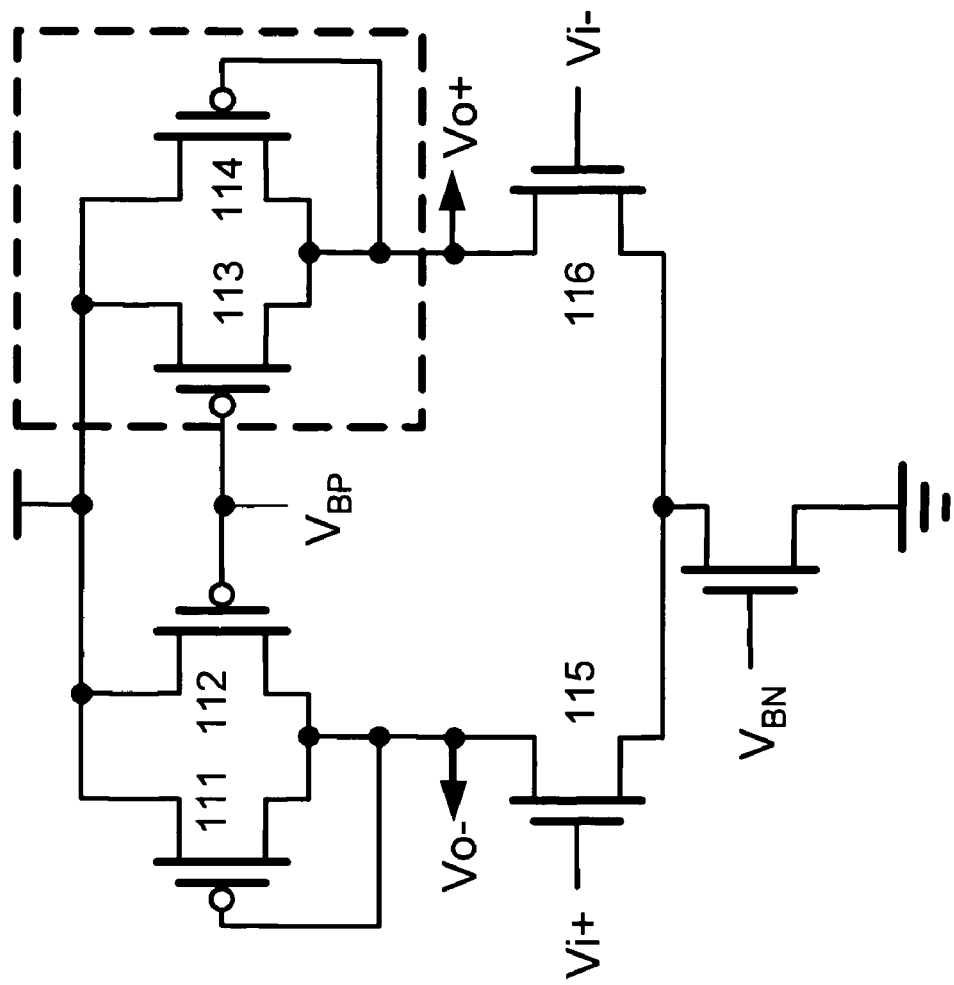
FIG. 2 depicts a delay element used in the voltage control delay line of a DLL-based clock generator in FIG. 1.
Figure 3:
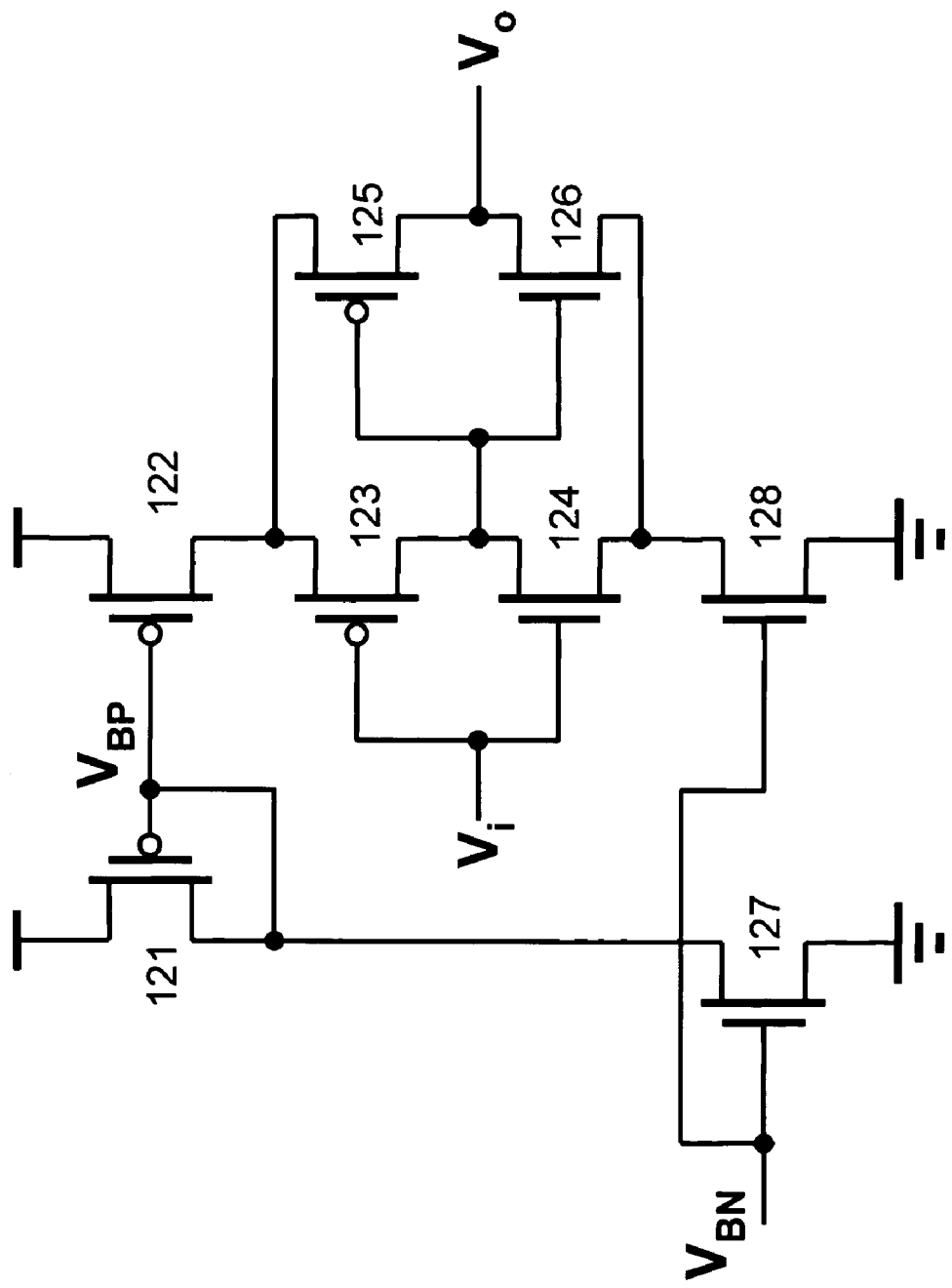
FIG. 3 depicts another delay element used in the voltage control delay line of a DLL-based clock generator in FIG. 1.
Figure 4:
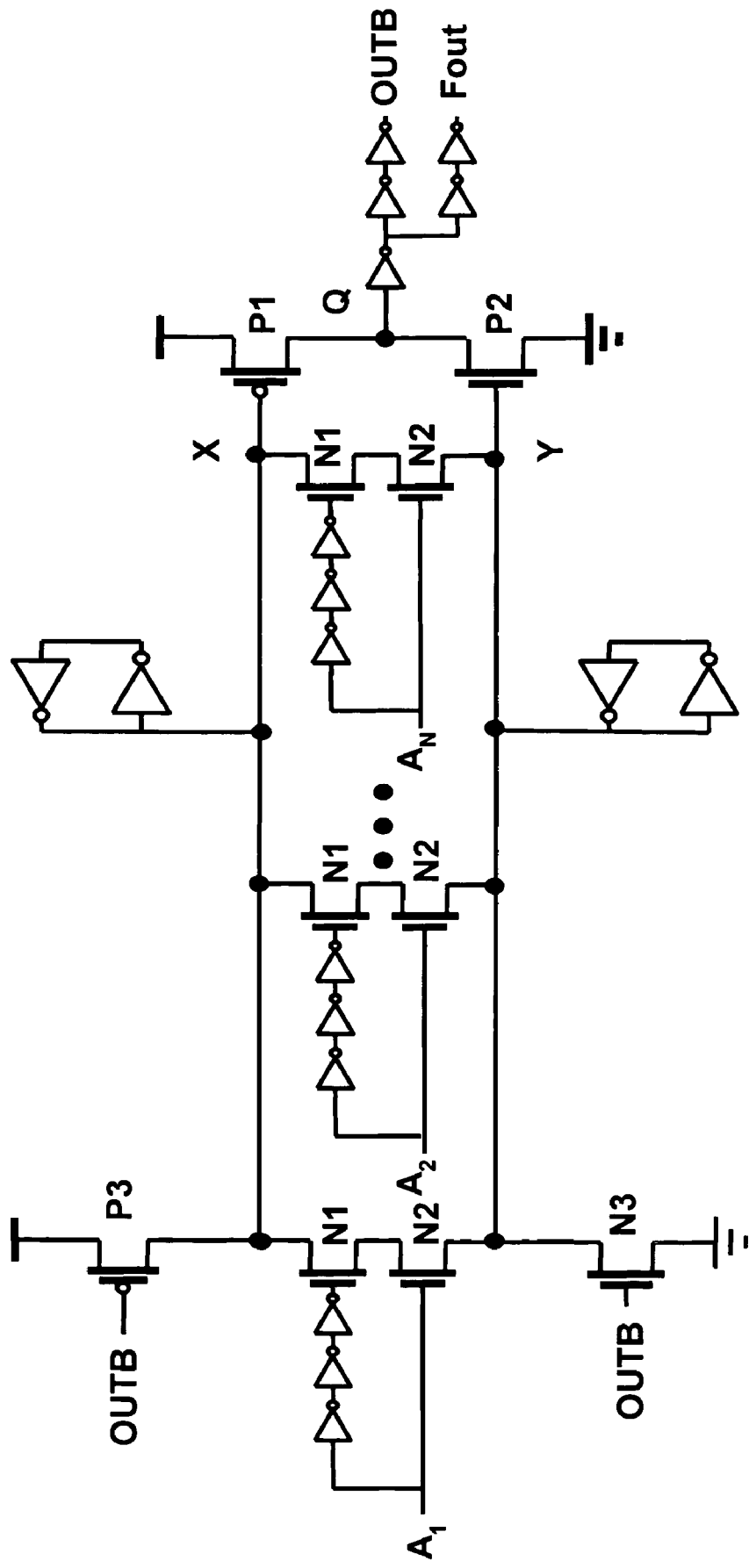
FIG. 4 depicts an edge combiner used in the clock generator in FIG. 1.

Reference will now be made in greater detail to a preferred embodiment of the invention, an example of which is illustrated in the accompanying drawings. The following description of the preferred embodiment(s) is merely exemplary in nature and is in no way intended to limit the invention, its application, or uses. For purposes of clarity, the same reference numbers will be used in the drawings to identify similar elements. Wherever possible, the same reference numerals are used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 5:
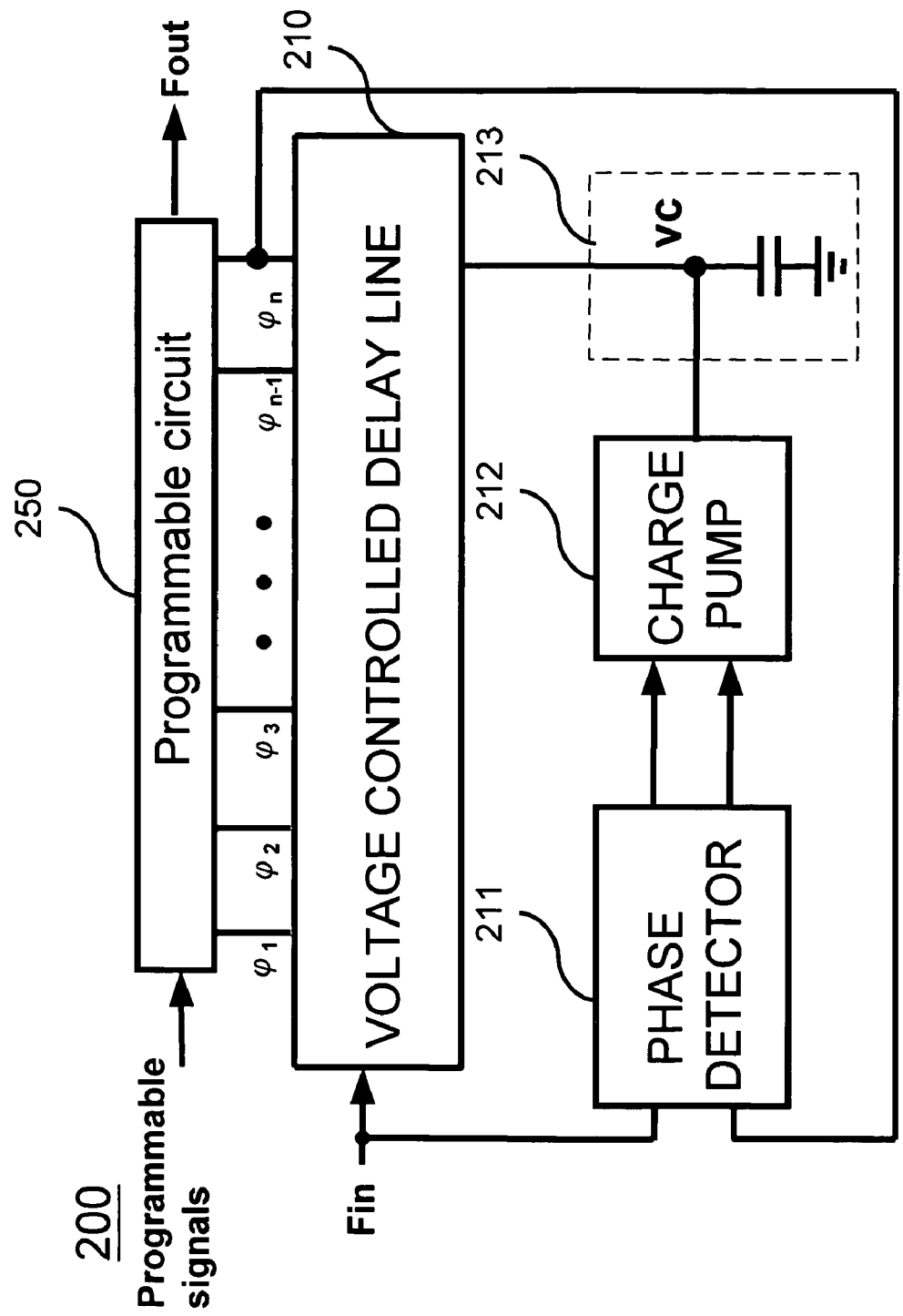
FIG. 5 depicts a programmable clock generator according to the embodiment of the invention.

Referring now to FIG. 5, illustrating a clock generator with a threshold-trigger delay circuit and a circular edge combiner. The clock generator 200 receives an input frequency Fin and thereby generates an output frequency Fout in response to the input frequency Fin. The frequency of the input frequency Fin may, for example, be lower than that of the output frequency Fout.

The clock generator 200 includes a DLL and a programmable circuit 250. A phase detector 211, a charge pump 212, and a low pass filter 213 are also included.

The phase detector 211 detects the phase of the input frequency Fin and generates control signals to the charge pump 212 for charge and discharge operation. The low pass filter 213 filters the output signals of the charge pump 212. The voltage controlled delay line 210 generates multi-phase signals to the programmable circuit 250 in response to the reference frequency Fin and the filtered signal from the low pass filter 213. The programmable circuit 250 is used as a local oscillator in the clock generator 200 to generator an output frequency Fout multiplied by a ratio of the input frequency. The programmable circuit 250 also receives programmable signals.

Figure 6:
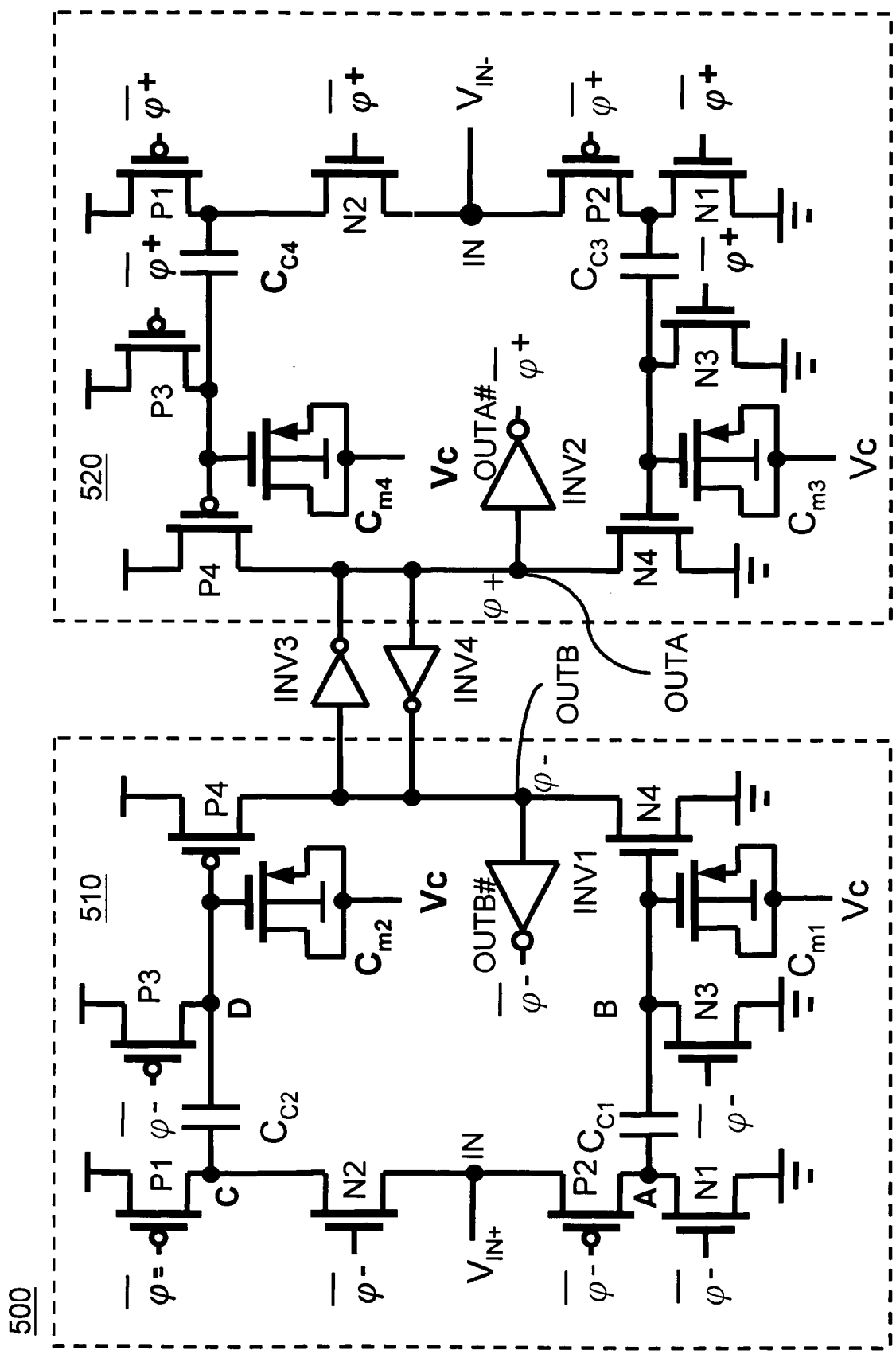
FIG. 6 depicts the delay element circuit in the voltage-controlled delay line of the clock generator shown in FIG. 5.

The delay element circuit 500 in the voltage-controlled delay line 210 is shown in FIG. 6. The split-path architecture is used to eliminate the short current. The delay circuit 500 includes a first high-threshold capacitor-coupling trigger 510 and a second high-threshold capacitor-coupling trigger 520, both of which have the same circuitry but receive differential input signal respectively. The high-threshold capacitor-coupling trigger 510, 520 have output signals at the output terminal OUTA, OUTB and the output signals φ+, φ− are delayed versions of the input signals Vin+, Vin−.

The fist high-threshold capacitor-coupling trigger 510 includes a voltage step-down detecting device, a voltage step-down charging device, a voltage step-up detecting device, and a voltage step-up discharging device.

The voltage step-down detecting device includes a PMOS P1 and an NMOS N2. The source and the gate of P1 are coupled to a power terminal and the output terminal OUTB# of the inverter INV, respectively. The drain and the gate of N2 are coupled to the drain of P1 and the output terminal OUTB# of the inverter INV, respectively. In addition, the source of N2 is used for receiving the input signal Vin+ at the input terminal IN and the drain of N2 is used as the output terminal of the voltage step-down detecting device. The voltage step-down charging device includes PMOSs P3 and P4. P4 is employed to charge the output terminal of the voltage step-down charging device in response to a voltage decrease at the gate of P4. The source, the gate, and the drain of P4 are coupled to a power terminal, the capacitor Cc2, and the output terminal φ− of the inverter, respectively. The drain of P4 is used as the output terminal of the voltage step-down charging device. P3 is used for charging the gate of P4 according to the output signal from the output terminal OUTB# of the inverter NV. The source, the drain, and the gate of P3 are coupled to the power terminal, the capacitor Cc2, and the output terminal OUTB# of the inverter INV, respectively. The voltage step-up detecting device includes an NMOS N1 and a PMOS P2. The source and the gate of N1 are coupled to a ground terminal and the output terminal OUTB# of the inverter INV, respectively. The drain and the gate of P2 are coupled to the drain of N1 and the output terminal OUTB# of the inverter INV respectively. Moreover, the source of P2 is used for receiving the input signal at the input terminal IN and the drain of P2 is used as the output terminal of the voltage step-up detecting device. The voltage step-up discharging device includes NMOSs N3 and N4. N4 is employed to discharge the output terminal of the voltage step-up discharging device in response to a voltage increase at the gate of N4. The source, the gate, and the drain of N4 are coupled to the ground terminal, the capacitor Cc1, and the input terminal of the inverter NV, respectively, wherein the drain of N4 is used as the output terminal of the voltage step-up discharging device. N3 is used for discharging the gate of N4 according to an output signal outputted from the output terminal OUTB# of the inverter NV. The source, the drain, and the gate of N3 are coupled to the ground terminal, the capacitor Cc1, and the output terminal OUTB# of the inverter INV, respectively.

The voltage step-down detecting device is used for detecting a slow decrease in the voltage of an input signal Vin+ and outputting a step-down signal corresponding to and being delayed against the slow decrease during the slow increase. When the input signal Vin+ decreases from a high level to a predetermined value, the voltage step-down detecting device outputs the step-down signal corresponding to the decrease of the input signal Vin+. The step-down signal, through the coupling effect of the capacitor Cc2, is then passed to the voltage step-down charging device. On receiving the step-down signal, the voltage step-down charging device begins charging the output terminal OUT according to the step-down signal. That is, the step-down transition of the input signal Vin+ from the high level to the predetermined value causes the output signal from the output terminal OUT to rise to a high level. In addition, the voltage step-up detecting device is used for detecting a slow increase in the voltage of the input signal Vin+ and outputting a step-up signal corresponding to and being delayed against the slow increase during the slow increase. When the input signal Vin+ increases from a low level to a predetermined value, the voltage step-up detecting device outputs the step-up signal corresponding to the increase of the input signal Vin+. The step-up signal, through the coupling effect of the capacitor Cc1, is then passed to the voltage step-up discharging device. On receiving the step-down signal, the voltage step-up discharging device begins discharging the output terminal OUT. That is, the step-up transition of the input signal Vin+ from the low level to the predetermined value causes the output signal from the output terminal OUT to fall to the low level.

Signals corresponding to the input signal can be employed for controlling the status of the high-threshold capacitor-coupling trigger 510 because the input signal (Vin+) at the input terminal controls the charging and discharging of the output terminal of the high-threshold capacitor coupling trigger 510. The voltage step-up discharging device can be made unaffected by the voltage decrease of the input signal Vin+ by disabling both the voltage step-up detecting device and the voltage step-up discharging device when the input signal Vin+ is in the high level. Likewise, the voltage step-down charging device can be made unaffected by the voltage increase of the input signal Vin+ by enabling both the voltage step-down detecting device and the voltage step-down charging device when the input signal Vin+ is in the low level. In addition, the input terminal of an inverter INV1 can be connected to the output terminal OUTB of the high-threshold capacitor-coupling trigger 510 so that the output terminal OUTB# of the inverter changes its voltage level as the output terminal OUTB does. In this way, the output signal at the output terminal OUTB can be used to control the status of the high-threshold capacitor-coupling trigger 510. Further, the status of the high-threshold capacitor-coupling trigger 510 can be controlled by the feedback of the signal similar to the output signal, for example, the output signal of a serial connection of two inverters coupled to the input terminal IN.

In the initial state of the first operation, the input signal Vin+ at the input terminal IN, the output voltage at the output terminal OUT, and the output signal B at the output terminal OUTB are supposed to have a voltage level of VDD, ground, and VDD, respectively. In addition, the input signal Vin+ is supposed to decrease from the voltage level of VDD. When Vin+ drops to VDD-Vt, the voltage at node C begins to fall with Vin+. The voltage signal at node C, that is, the output signal of the voltage step-down detecting device, is referred to as a step-down signal. The step-down signal is then coupled to node D by the capacitor coupling effect of the capacitor Cc2. As a result, the voltage at node D also drops with that at node C. When the voltage at node D drops by a value of Vt, P4 is enabled to charge the output terminal OUT. When the voltage at the output terminal OUT reaches the value of VDD, the output signal will be zero. In this case, the PMOSs P1, P2, P3 are enabled to charge nodes D and C. In the second operation, the input signal Vin+ is supposed to rise from zero. When the input signal Vin+ increases to the value of Vt, the voltage at node A starts to rise with the input signal Vin+. The voltage signal at node A, that is, the output signal of the voltage step-up detecting device is called a step-up signal. The step-up signal is then coupled to node B by the capacitor coupling effect of the capacitor Cc1. Hence, the voltage at node B rises with that at node A. When the voltage at node B drops by a value of Vt, N4 is enabled to discharge the output terminal OUT. When the voltage at the output terminal OUT reaches the value of zero, the output signal B will be equal to VDD. In this case, the NMOSs N1, N2, N3 are enabled to discharge nodes B and A.

Two variable capacitors Cm1, Cm2 are employed in the fist high-threshold capacitor-coupling trigger 510 to adjust the delay time of the output signal OUTB. The variable capacitors Cm1, Cm2 are implemented by inversion-mode PMOS capacitors biased by the control voltage Vc which may control the delay time of the high-threshold capacitor-coupling trigger. The details may be illustrated by capacitor coupling technique, which is given in below.

According to the charge coupling, the transition of signal VA at the node A results in charge injection to the signal VB at the node B. The relationship between the voltage transitions $\Delta VA$ and $\Delta VB$ is as following:

$$\Delta VB = [Cc1/(Cc1+Cm1+Cp)] \times \Delta VA$$

where Cc1, Cm1, and Cp represent the coupling capacitance, the variable MOS capacitor and total parasitic capacitance at node B respectively.

It is seen that $\Delta VB$ is proportional to Cc1 and $\Delta VA$, and inversely proportional to Cm1. Decrease of Cc1 results in smaller $\Delta VB$, while decrease of Cm1 leads larger $\Delta VB$. Thus, $\Delta VB$ may be obtained by biasing the MOS capacitor Cm1. The output current depends on the voltage VB. Therefore, the delay time is variable to the control voltage Vc. The capacitor coupling technique is applied to adjust the gate threshold voltage of the threshold-trigger delay element, The circuitry of the second high-threshold capacitor-coupling trigger 520 is duplicated of the first high-threshold capacitor-coupling trigger 510. The operation, and the function, which are the same/similar to the first high-threshold capacitor-coupling trigger 510 are abbreviated.

Two inverters INV3 and INV4 are additionally connected at the output of the high-threshold capacitor-coupling trigger for receiving the output voltage OUTB and OUTA respectively, The inverters are added to keep 180 degrees phase difference, increase output gain and avoid floating of the output signal OUTA and OUTB. Two weak cross-coupled inverters are added to reduce signals jitter and keep 180°-phase differences. They also avoid floating of output terminal OUT.

Figure 7:
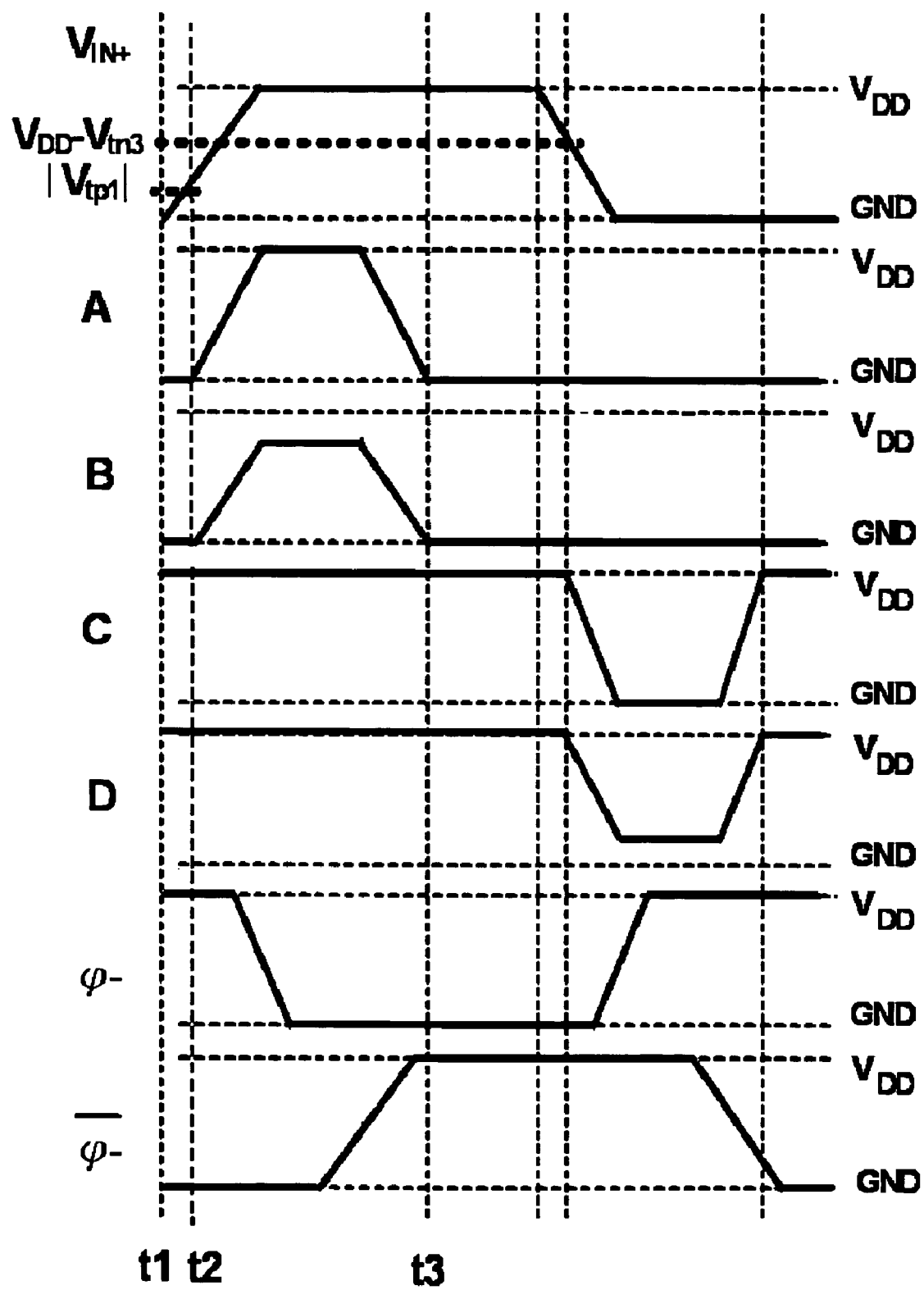
FIG. 7 depicts the waveforms of the high-threshold capacitor-coupling trigger in FIG. 6.

The waveforms of the high-threshold capacitor-coupling trigger are illustrated in FIG. 7. At time t1, the input signal Vin+ starts to make a low-to-high transition. Signal A does not follow the signal transition of the signal Vin+ immediately.

At time t2, the signal Vin+ is pulled up to |Vtp1|, |Vgs| of the PMOS P2 is larger than |Vtp1|, and P2 turns on, then the signal VA starts to be pulled down through PMOS P2. Simultaneously, the signal VB follows the transition of the signal VA by the coupling effect. As Vgs of N4 is larger than its threshold voltage Vtn, N4 is turned. The output signal OUTB is pulled down to GND. Then OUTB# is pulled up to VDD. P2 is turned off and N2 is turned on. Vin+ is isolated to the signal VA. The signal VC is connected to Vin+. N1 and N3 are turned on. Signals VA and VB are discharged to GND.

At time t3, the conditions of the signals VA, VB, VC, and VD, are set to receive the next high-to-low transition of the signal Vin+. The signals Vin+ and Vin- are complementary. According to the same operating principle, the output signal OUTA is pulled up to VDD through the high-to-low transition of the input signal Vin-.

Figure 8:
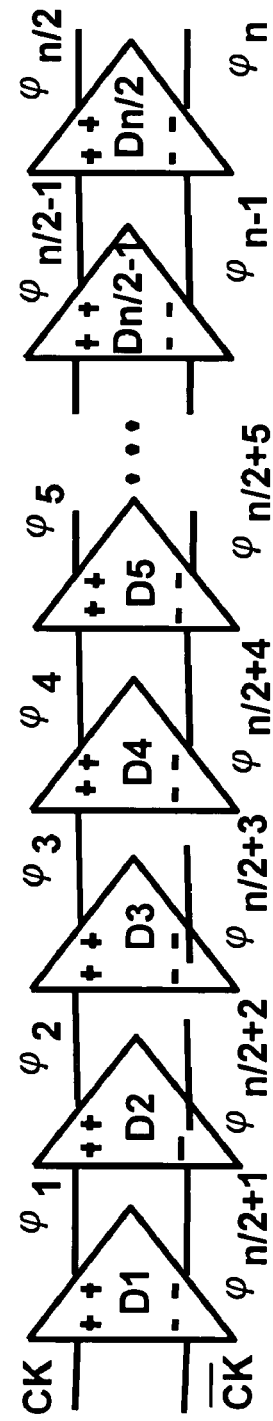
FIG. 8 depicts the voltage-controlled delay line using the delay element circuit in FIG. 6.

The voltage-controlled delay line 210 using the delay circuit 500 is shown in FIG. 8. There are n/2 differential delay elements in the voltage-controlled delay line 210. The n/2 differential delay elements D1~Dn/2 along the delay line generate n signal phases presented by $\phi 1, \phi 2, \ldots, \phi n$. The n-phase signals interchange to a circular phase walking chart shown in FIG. 9. Each pair of the signals on the two side of a dashed line implied two complementary with 180 degrees phase shift.

Figure 10:
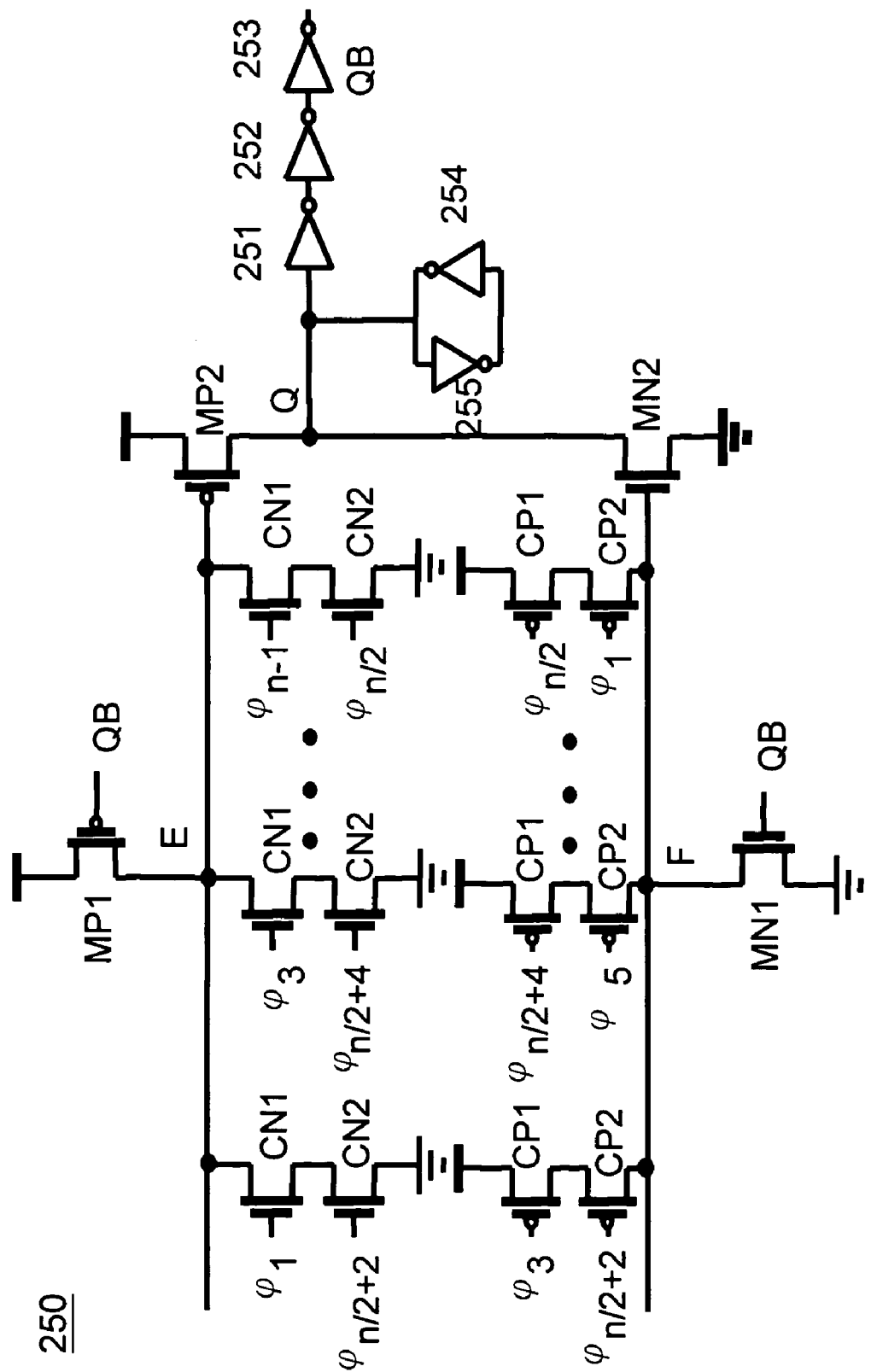
FIG. 10 depicts the circular edge combiner 250 used in the clock generator of the embodiment.

Now refer to FIG. 10 illustrating the circular edge combiner 250 used in the clock generator.

Figure 9:
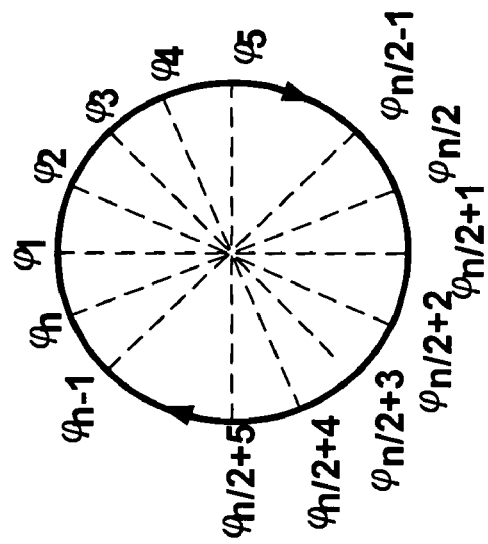
FIG. 9 depicts the circular phase walking chart of the signals of the voltage-controlled delay line using the delay element circuit.

The circular edge combiner 250 receive a plurality of signals $\phi 1, \phi 2, \ldots, \phi n$ from the voltage-controlled delay line 210 shown in FIG. 8 and FIG. 9. The circular edge combiner 250 includes a plurality of first inverters 251~253 connected in series. The input terminal of the second inverter 254 being coupled to the output terminal of the third inverter 255, and the output terminal of the second inverter 254 being coupled to the input terminal of the third inverter 255 and the input terminal of the first inverter of the plurality of the first inverters. The first PMOS MP1, the source and the gate of the first PMOS being coupled to a power terminal and the output of the last inverter of the first inverters. The source and the drain of the second PMOS MP2 are coupled to the power terminal and the input terminal of the first inverter 251 of the plurality of the first inverters. There are 2n sets of cascaded NMOS CN1 and CN2. One terminal of the cascaded NMOS is coupled to the gate of the second PMOS MP2, and the other terminal of the cascaded NMOS is coupled to the ground. The source and the gate of the first NMOS MN1 are coupled to the ground and the output of the last inverter 253 of the first inverters. The source and the drain of the second NMOS MN2 is coupled to the ground and the drain of the second PMOS MP2. One terminal of the cascaded PMOS CP1 and CP2 is coupled to the power terminal, and the other terminal of the cascaded PMOS is coupled to the gate of the second NMOS.

The circular edge combiner 250 is triggered by combination of two rising or two falling signals. Assume the initial condition of the signal QB is VDD, the signal at the node F is pulled down to GND through the NMOS NM1. The NMOS MN2 is turned off. For example, after the rising edges of the signals $\phi 1$ and $\phi n/2+2$, the two cascaded NMOS transistors are turned on, and the node E is being discharged. As |Vgs| of the PMOS MP2 exceeds its own threshold voltage |Vtp|, the PMOS MP2 is turned on. Thus, the output signal at the node Q is pulled up to VDD. After delayed by three inverters, the complementary signal QB is pulled down to GND. Then the signal at the node E is pulled up through the transistor MP1, and MP2 is turned off later.

After the falling edge of the signal φ3 and φn/2+2, two cascaded PMOS transistors are turned on. As Vgs of MN2 exceeds its own threshold voltage Vtn, MN2 is turned. The output signal at node Q is pulled downed to GND. Therefore, the output clock signal toggles at every rising and falling edge at the combination of the n-phase signals along the delay line.

The VCDL generates n-phase signals. The output clock frequency can be expressed as:

Fout=Fref×n/2, {n=even integer, n>=2}, where Fref is the input signal and Fout is the output signal. The multiplication factor n/2 of the proposed frequency multiplier can be chosen according to the number of the delay elements 500.

Figure 11:
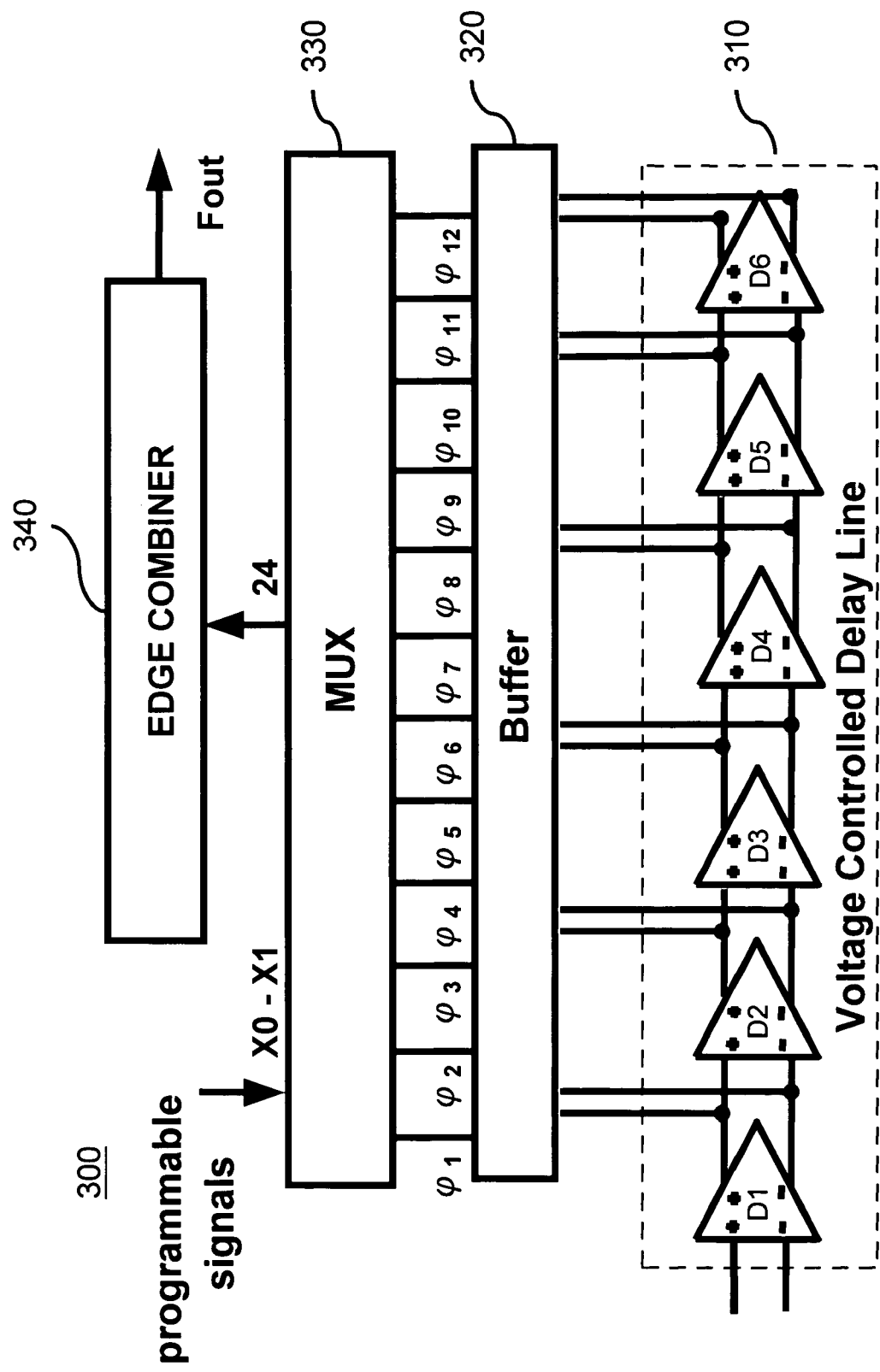
FIG. 11 depicts another embodiment of the clock generator with a programmable circuit of multiply by 1/2/3/6 edge combiner.
Figure 12:
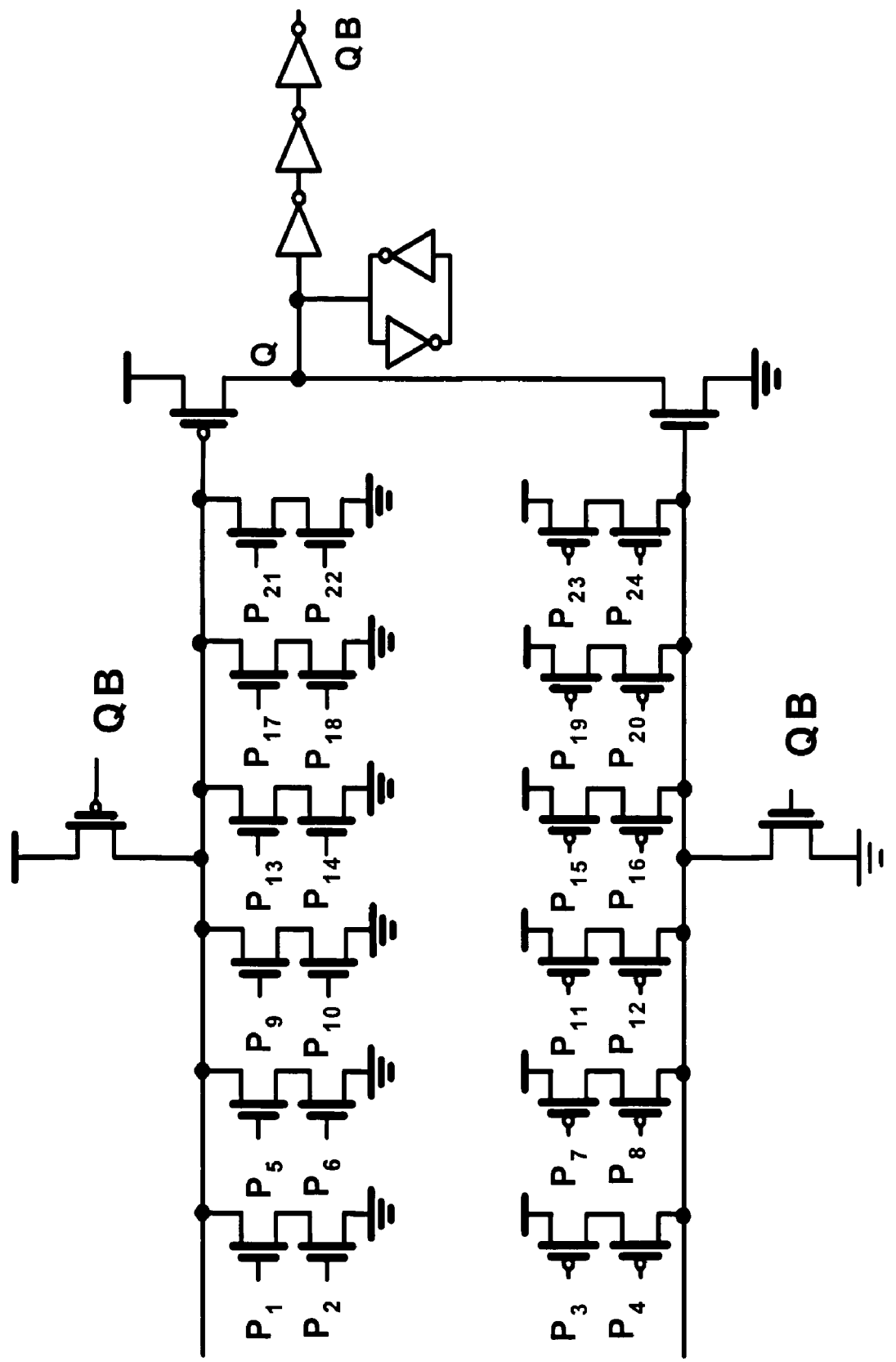
FIG. 12 depicts the circuitry of the programmable edge combiner of the clock generator with a programmable circuit shown in FIG. 11

Now refer to FIG. 11 illustrating another embodiment of the clock generator 300 with a programmable circuit of multiply by 1/2/3/6 edge combiner 340. A buffer 320 is provided to receive the delay signals form the VCDL 310 and deliver to the multiplexer 330. The edge combiner 340 receives the output signals of the multiplexer 330 and delivers the output frequency Fout. X0 and X1 are programming control signals which represent multiplication factor. There are six delay elements D1~D6 in the VCDL 310 which generate 12-phase signals φ1~φ12 to the buffer. The multiplexer receives the 12-phase signals φ1~φ12 to the edge combiner 340. The circuitry of the edge combiner 340 is shown in FIG. 12.

FIG. 13 lists the condition of the input signals of the edge combiner to multiply-by-1, 2, 3 or 6, where φ1~φ12 are 12-phase delay signals from the VCDL. In FIG. 13, case 1 is based on original phase condition; Case 2 is rearranged for a more balanced loading on the 12-phase signals.

Figure 14:
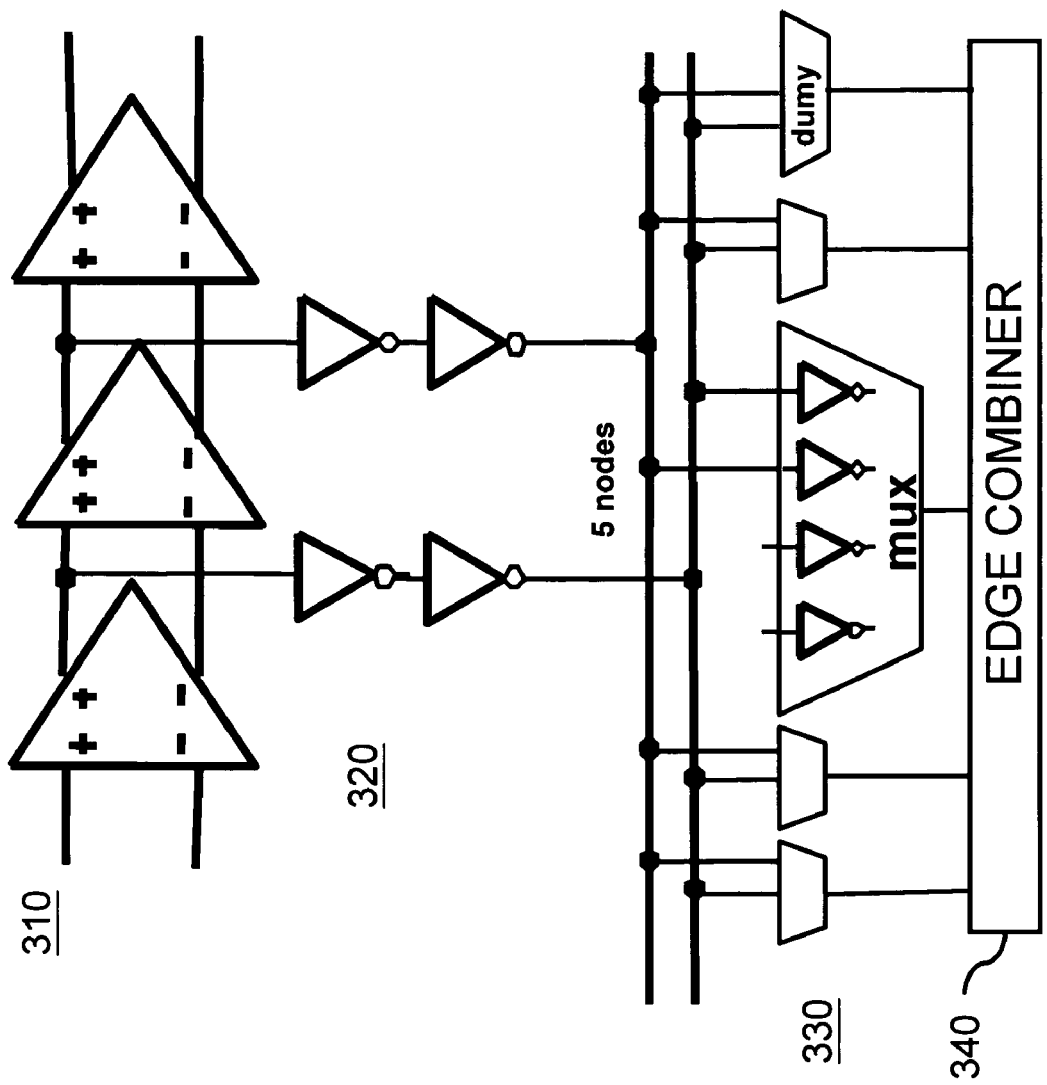
FIG. 14 illustrates dummy insertion for balanced loading.

Refer to FIG. 14 illustrating another embodiment of the clock generator. To obtain an output frequency with low jitter, the capacitive loading on the signal delay paths form the VCDL 310 to the buffer 320, the multiplexer 330 and the edge combiner 340 have to be balanced to maintain equal delay time on every signal. The output nodes form the buffer to the multiplexer require dummy circuitry to balance the load, making rising/falling delay time on every node equally. Any of the output nodes from the buffer may push 5 multiplexers at most. If the number of push multiplexers is less than 5, a number of dummy should be applied to the output node of the buffer.

Figure 15:
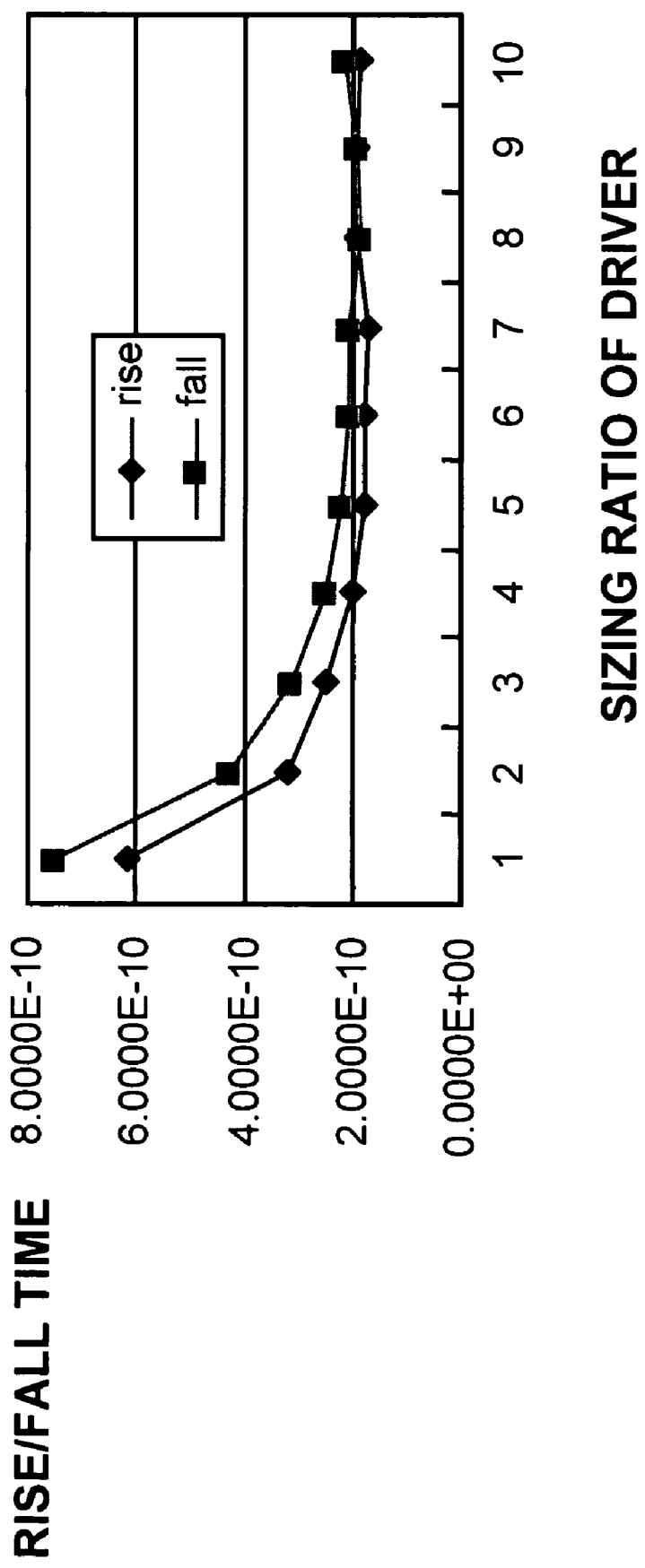
FIG. 15 illustrates the analysis on buffer size optimization.

FIG. 15 illustrates the analysis of buffers optimization. The proper buffers are chosen to perform the least jitter. Because too large buffers size rise larger noise, which causes signal jitter and power consumption. Too small buffers size may not push the next stage and the signal will be distorted. The parasitic capacitance and resistance on the wire form the buffer to the multiplexer are taken on the simulation. The edge combiner extends the output operating frequency. Meanwhile, the multiplication factor can be flexible with the increase of the number of delay elements. The balance of loading on the delay paths can be easily achieved to generate a low jitter output signal.

A DLL-based CMOS programmable clock generator is provided. There is no cycle-to-cycle jitter accumulation alone the clock cycles thorough the VCDL. A low-jitter output signal is generated by employing an external high-Q quartz crystal oscillator. A threshold-trigger delay element with full swing complementary output signals consumes no dc power. It exhibits small delay error resulting reduced out jitter. It also increases the linearity of delay time versus control voltage. A circular edge combiner may operate at a low supply voltage. It performs symmetrical rise and fall time operation.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A circuit for delaying an input signal comprising:
 a first and a second high-threshold capacitor-coupling trigger, which receive an input signal at an input terminal of the trigger, and outputs an output signal at an output terminal of the trigger according to the input signal, each comprising:
  voltage step-down detecting means, with an output terminal, in response to a slow decrease in the voltage level of the input signal, for producing a step-down signal at the output terminal of the voltage step-down detecting means, wherein the step-down signal corresponds to and is delayed against the slow decrease during the slow increase;
  a first capacitor, coupled to the output terminal of the voltage step-down detecting means at one terminal of the first capacitor, for coupling the step-down signal with the other terminal of the first capacitor;
  voltage step-down charging means, having an input terminal coupled to the other terminal of the first capacitor, having an output terminal coupled to the output terminal of the trigger, and being controlled by the step-down signal from the first capacitor, for charging the output terminal of the trigger;
  voltage step-up detecting means, in response to a slow increase in the voltage level of the input signal, for producing a step-up signal corresponding to and being delayed against the slow increase during the slow increase;
  a second capacitor, coupled to an output terminal of the voltage step-up detecting means at one terminal of the second capacitor, for coupling the step-up signal with the other terminal of the second capacitor;
  voltage step-up discharging means, having an input terminal coupled to the other terminal of the second capacitor, having an output terminal coupled to the input terminal of the trigger, and being controlled by the step-up signal from the second capacitor, for discharging the output terminal of the trigger;
 a first inversion-mode PMOS capacitor, the gate being coupled to the other terminal of the first capacitor, for control the delay time of the output signal in response to a control voltage;
 a second inversion-mode PMOS capacitor the gate being coupled to the other terminal of the second capacitor, for control the delay time of the output signal in response to a control voltage;
 a first inverter, the input terminal and the output terminal of the first inverter being coupled to the output terminal of the first high-threshold capacitor-coupling trigger and the output terminal of the second high-threshold capacitor-coupling trigger respectively; and
 a second inverter, the input terminal and the output terminal of the second inverter being coupled to the output terminal of the second high-threshold capacitor-coupling trigger and the output terminal of the first high-threshold capacitor-coupling trigger respectively.

2. The circuit according to claim 1, each high-threshold capacitor-coupling trigger further comprising:

an output inverter, having an input terminal coupled to the output terminal of the high-threshold capacitor-coupling trigger and having an output terminal coupled to the voltage step-down detecting means, the voltage step-up detecting means, the voltage step-down charging means, and the voltage step-up discharging means, the inverter being used for controlling the high-threshold coupling-counter trigger.

3. The circuit according to claim 2, wherein each voltage step-down detecting means comprises:

a PMOS, the source and the gate of the PMOS being coupled to a power terminal and the output terminal of the output inverter respectively; and an NMOS, the drain and the gate of the NMOS being coupled to the drain of the PMOS and the output terminal of the output inverter respectively, wherein the source of the NMOS is used for receiving the input signal and the drain of the NMOS is used as the output terminal of the voltage step-down detecting means.

4. The circuit according to claim 2, wherein each voltage step-down charging means comprises:

a first PMOS, for charging the output terminal of the voltage step-down charging means in response to a decrease in voltage at the gate of the first PMOS, wherein the source, the gate, and the drain of the first PMOS are coupled to a power terminal, the first capacitor, and the output terminal of the output inverter respectively, and the drain of the first PMOS is used as the output terminal of the voltage step-down charging means; and a second PMOS for charging the gate of the first PMOS according to an output signal outputted from the output terminal of the output inverter, wherein the source, the drain, and the gate of the second PMOS are coupled to the power terminal, the first capacitor, and the output terminal of the output inverter respectively.

5. The circuit according to claim 2, wherein each voltage step-up detecting means comprises:

an NMOS, the source and the gate of the NMOS being coupled to a ground terminal and the output terminal of the output inverter respectively; and a PMOS, the drain and the gate of the PMOS being coupled to the drain of the NMOS and the output terminal of the output inverter respectively, wherein the source of the PMOS is used for receiving the input signal of the apparatus and the drain of the PMOS is used as the output terminal of the voltage step-up detecting means.

6. The circuit according to claim 2, wherein voltage step-up discharging means comprises:

a first NMOS, for discharging the output terminal of the voltage step-up discharging means in response to an increase in voltage at the gate of the first NMOS, wherein the source, the gate, and the drain of the first NMOS are coupled to a ground terminal, the second capacitor, and the input terminal of the output inverter respectively, and the drain of the first NMOS is used as the output terminal of each voltage step-up discharging means; and a second NMOS for discharging the gate of the first NMOS according to an output signal outputted from the output terminal of the output inverter, wherein the source, the drain, and the gate of the second NMOS are coupled to the ground terminal, the second capacitor, and the output terminal of the output inverter respectively.

7. A delay circuit comprising n/2 differential delay elements connected in series to generate n-phase signals, each delay element comprising the circuit of claim 1, wherein an nth signal and an (n+n/2)th of the n-phase signals are complementary with 180 degrees phase shift.

8. A circuit for outputting a frequency in response to a plurality of n-phase delay signals, comprising:

a plurality of first inverters connected in series;

a second inverter and a third inverter, the input terminal of the second inverter being coupled to the output terminal of the third inverter, and the output terminal of the second inverter being coupled to the input terminal of the third inverter and the input terminal of the first inverter of the plurality of the first inverters;

a first PMOS, the source and the gate of the first PMOS being coupled to a power terminal and the output of the last inverter of the first inverters;

a second PMOS, the source and the drain being coupled to the power terminal and the input terminal of the first inverter of the plurality of the first inverters;

n sets of cascaded NMOS, one terminal of the cascaded NMOS being coupled to the gate of the second PMOS, and the other terminal of the cascaded NMOS being coupled to the ground;

a first NMOS, the drain and the gate of the first NMOS being coupled to the ground and the output of the last inverter of the first inverters;

a second NMOS, the drain and the source the being coupled to the ground and the drain of the second PMOS; and n sets of cascaded PMOS, one terminal of the cascaded PMOS being coupled to the power terminal, and the other terminal of the cascaded PMOS being coupled to the gate of the second NMOS.

9. A clock generator for receiving an input frequency and thereby generating an output frequency in response to the input frequency comprising:

a voltage controlled delay line for generating multi-phase signals in response to the input frequency, wherein the multi-phase signals are delayed from the input signal, the voltage controlled delay line comprising:

a first and a second high-threshold capacitor-coupling trigger, which receive an input signal at an input terminal of the trigger, and outputs an output signal at an output terminal of the trigger according to the input signal, each comprising:

voltage step-down detecting means, with an output terminal, in response to a slow decrease in the voltage level of the input signal, for producing a step-down signal at the output terminal of the voltage step-down detecting means, wherein the step-down signal corresponds to and is delayed against the slow decrease during the slow increase;

a first capacitor, coupled to the output terminal of the voltage step-down detecting means at one terminal of the first capacitor, for coupling the step-down signal with the other terminal of the first capacitor;

voltage step-down charging means, having an input terminal coupled to the other terminal of the first capacitor, having an output terminal coupled to the output terminal of the trigger, and being controlled by the step-down signal from the first capacitor, for charging the output terminal of the trigger;

voltage step-up detecting means, in response to a slow increase in the voltage level of the input signal, for producing a step-up signal corresponding to and being delayed against the slow increase during the slow increase;

a second capacitor, coupled to an output terminal of the voltage step-up detecting means at one terminal of the second capacitor, for coupling the step-up signal with the other terminal of the second capacitor;

voltage step-up discharging means, having an input terminal coupled to the other terminal of the second capacitor, having an output terminal coupled to the input terminal of the trigger, and being controlled by the step-up signal from the second capacitor, for discharging the output terminal of the trigger;

a first inversion-mode PMOS capacitor, the gate being coupled to the other terminal of the first capacitor, for control the delay time of the output signal in response to a control voltage;

a second inversion-mode PMOS capacitor the gate being coupled to the other terminal of the second capacitor, for control the delay time of the output signal in response to a control voltage;

a first inverter, the input terminal and the output terminal of the first inverter being coupled to the output terminal of the first high-threshold capacitor-coupling trigger and the output terminal of the second high-threshold capacitor-coupling trigger respectively; and a second inverter, the input terminal and the output terminal of the second inverter being coupled to the output terminal of the second high-threshold capacitor-coupling trigger and the output terminal of the first high-threshold capacitor-coupling trigger respectively;

a programmable circuit for receiving the multi-phase signals and generating an output frequency multiplied by a ratio of the input frequency, the programmable circuit comprising:

a plurality of first inverters connected in series;

a second inverter and a third inverter, the input terminal of the second inverter being coupled to the output terminal of the third inverter, and the output terminal of the second inverter being coupled to the input terminal of the third inverter and the input terminal of the first inverter of the plurality of the first inverters;

a first PMOS, the source and the gate of the first PMOS being coupled to a power terminal and the output of the last inverter of the first inverters;

a second PMOS, the source and the drain being coupled to the power terminal and the input terminal of the first inverter of the plurality of the first inverters;

n sets of cascaded NMOS, one terminal of the cascaded NMOS being coupled to the gate of the second PMOS, and the other terminal of the cascaded NMOS being coupled to the ground;

a first NMOS, the drain and the gate of the first NMOS being coupled to the ground and the output of the last inverter of the first inverters;

a second NMOS, the drain and the source the being coupled to the ground and the drain of the second PMOS; and n sets of cascaded PMOS, one terminal of the cascaded PMOS being coupled to the power terminal, and the other terminal of the cascaded PMOS being coupled to the gate of the second NMOS.

10. The clock generator according to claim 9, each high-threshold capacitor-coupling trigger further comprising:

an output inverter, having an input terminal coupled to the output terminal of the high-threshold capacitor-coupling trigger and having an output terminal coupled to the voltage step-down detecting means, the voltage step-up detecting means, the voltage step-down charging means, and the voltage step-up discharging means, the output inverter being used for controlling the high-threshold capacitor-coupling trigger.

11. The clock generator according to claim 10, wherein each voltage step-down detecting means comprises:

a PMOS, the source and the gate of the PMOS being coupled to a power terminal and the output terminal of the output inverter respectively; and an NMOS, the drain and the gate of the NMOS being coupled to the drain of the PMOS and the output terminal of the output inverter respectively, wherein the source of the NMOS is used for receiving the input signal and the drain of the NMOS is used as the output terminal of the voltage step-down detecting means.

12. The clock generator according to claim 10, wherein each voltage step-down charging means comprises:

a first PMOS, for charging the output terminal of the voltage step-down charging means in response to a decrease in voltage at the gate of the first PMOS, wherein the source, the gate, and the drain of the first PMOS are coupled to a power terminal, the first capacitor, and the output terminal of the output inverter respectively, and the drain of the first PMOS is used as the output terminal of the voltage step-down charging means; and a second PMOS for charging the gate of the first PMOS according to an output signal outputted from the output terminal of the output inverter, wherein the source, the drain, and the gate of the second PMOS are coupled to the power terminal, the first capacitor, and the output terminal of the output inverter respectively.

13. The clock generator according to claim 10, wherein each voltage step-up detecting means comprises:

an NMOS, the source and the gate of the NMOS being coupled to a ground terminal and the output terminal of the output inverter respectively; and a PMOS, the drain and the gate of the PMOS being coupled to the drain of the NMOS and the output terminal of the output inverter respectively, wherein the source of the PMOS is used for receiving the input signal of the apparatus and the drain of the PMOS is used as the output terminal of the voltage step-up detecting means.

14. The clock generator according to claim 10, wherein voltage step-up discharging means comprises:

a first NMOS, for discharging the output terminal of the voltage step-up discharging means in response to an increase in voltage at the gate of the first NMOS, wherein the source, the gate, and the drain of the first NMOS are coupled to a ground terminal, the second capacitor, and the input terminal of the output inverter respectively, and the drain of the first NMOS is used as the output terminal of each voltage step-up discharging means; and a second NMOS for discharging the gate of the first NMOS according to an output signal outputted from the output terminal of the output inverter, wherein the source, the drain, and the gate of the second NMOS are coupled to the ground terminal, the second capacitor, and the output terminal of the output inverter respectively.

* * * * *